(12) United States Patent
Lenz et al.

(10) Patent No.: US 7,323,359 B2
(45) Date of Patent: Jan. 29, 2008

(54) MOUNTING METHOD FOR A SEMICONDUCTOR COMPONENT

(75) Inventors: Michael Lenz, Zorneding (DE); Ralf Otremba, Kaufbeuern (DE); Herbert Roedig, Neutraubling (DE)

(73) Assignee: Infineon Technologies AG, Munich (DE)

( * ) Notice: Subject to any disclaimer, the term of this patent is extended or adjusted under 35 U.S.C. 154(b) by 182 days.

(21) Appl. No.: 10/902,534

(22) Filed: Jul. 29, 2004

(65) Prior Publication Data

US 2005/0099757 A1    May 12, 2005

(30) Foreign Application Priority Data

Jul. 31, 2003    (DE)    ................ 103 35 111

(51) Int. Cl.
*H01L 21/26* (2006.01)
*H01L 21/66* (2006.01)
*H01L 21/44* (2006.01)
*H01L 21/48* (2006.01)
*H01L 21/50* (2006.01)

(52) U.S. Cl. .................. 438/106; 438/14; 438/15; 438/200

(58) Field of Classification Search ................ 438/106, 438/14, 11, 15, 200, 18
See application file for complete search history.

(56) References Cited

U.S. PATENT DOCUMENTS

| 3,238,425 A | 3/1966 | Geyer |
| 5,126,919 A * | 6/1992 | Yamamoto et al. ......... 361/700 |
| 5,954,978 A | 9/1999 | Seelert et al. |
| 6,031,279 A | 2/2000 | Lenz |
| 6,461,891 B1 * | 10/2002 | Dishongh et al. ........... 438/106 |
| 6,554,244 B1 | 4/2003 | Remy De Graffenried et al. |
| 6,563,225 B2 * | 5/2003 | Soga et al. ................. 257/772 |
| 2002/0149114 A1 | 10/2002 | Soga et al. |
| 2002/0166688 A1 * | 11/2002 | Smith ........................ 174/52.2 |

FOREIGN PATENT DOCUMENTS

| DE | 1 254 773 | 5/1968 |
| DE | 15 14 561 | 10/1975 |
| EP | 0 875 331 | 11/1998 |
| FR | 1.480.792 | 12/1967 |

* cited by examiner

*Primary Examiner*—Chuong Anh Luu
(74) *Attorney, Agent, or Firm*—Dicke, Billig & Czaja, PLLC

(57) ABSTRACT

A mounting method for a semiconductor component. The method includes application of solder material to the semiconductor component, application of at least one contact/mounting element made of semiconductor material and/or metal and/or insulator material to the solder material, heating of at least one part of the semiconductor component to a temperature lying above the melting point of the solder material by impressing an electrical power into the semiconductor component, as a result of which corresponding soldering connections arise between the semiconductor component and the at least one contact/mounting element, and cooling of the connection complex that comprises the semiconductor component and at least one contact/mounting element and was produced in the preceding step.

19 Claims, 4 Drawing Sheets

MOUNTING METHOD FOR A SEMICONDUCTOR COMPONENT

CROSS-REFERENCE TO RELATED APPLICATIONS

This Utility Patent Application claims priority to German Patent Application No. DE 103 35 111.6, filed on Jul. 31, 2003, which is incorporated herein by reference.

BACKGROUND

The invention relates to a mounting method for a semiconductor component.

Mounting methods for semiconductor components, in particular power semiconductor components, are known. In this case, a material stack, comprising the semiconductor component, solder material applied thereto, and contact/mounting elements applied on the solder material, is usually heated in its entirety to relatively high temperatures (up to 450° C.) in order to produce a soldering connection between the semiconductor component and the contact/mounting elements. Such a mounting method is illustrated in FIG. 1 and will briefly explained below.

In a first process step PS1, a contact/mounting element 1 (referred to hereinafter as "mounting element"), for example, a "leadframe" is heated to a temperature of approximately 400° C. and the surface thereof is cleaned by means of a gas treatment. The mounting element 1 is composed of copper, for example, and can serve as a cooling element. In a second process step PS2, the mounting element 1 is cooled to a temperature of approximately 380° C., and solder material 2 is applied to the surface of the mounting element 1 from a container 4. The applied solder material 2 is distributed on the surface of the mounting element 1 automatically in a third process step PS3, a semiconductor component 3 being applied to the solder material 2 in a fourth process step PS4 (for example by means of a corresponding pressing method by means of a pressing device 5). In a fifth process step PS5, a connection complex comprising mounting element 1, solder material 2 and semiconductor component 3 is cooled to approximately 200° C. (for example by water cooling or air cooling), whereby the hitherto liquid solder material 2 solidifies. This results in a "fixed", hardened soldering connection between the mounting element 1 and the semiconductor component 3.

The method described in FIG. 1 has the disadvantage that an oxidation of the mounting element 1 takes place on account of the heating of the entire material stack (mounting element 1, solder material 2 and semiconductor chip 3). This may result in problems insofar as the reliability of the adhesion of the semiconductor component 3 on the mounting element 1 is concerned. Additional process steps are necessary in order to avoid this disadvantage.

SUMMARY

In one embodiment of the invention, a mounting method is specified for a semiconductor component in which the problem described above can be avoided. The mounting method for a semiconductor component includes, application of solder material to the semiconductor component and/or to at least one contact/mounting element made of metal and/or semiconductor material and/or insulator material, application of the at least one contact/mounting element to the semiconductor component in such a way that the solder material is situated between the semiconductor component and the at least one contact/mounting element, impressing of an electrical power into the semiconductor component in order to heat at least one part of the semiconductor component to a temperature lying above the melting point of the solder material, as a result of which corresponding soldering connections arise between the semiconductor component and the at least one contact/mounting element, and cooling of the connection complex that comprises the semiconductor component and the at least one contact/mounting element and was produced in the preceding step.

In one embodiment of the invention, the semiconductor component is heated only during the mounting method. The heated semiconductor component transmits generated heat to the solder material, which is consequently caused to melt, whereby a soldering connection can form between the semiconductor component and the mounting element. Heating of the mounting element to high temperatures and a resultant oxidation can thus be avoided.

Generally, semiconductor components are respectively contact-connected with terminals/heat sinks at their top side and underside. According to one embodiment of the invention, therefore, the solder material is applied to a top side and an underside of the semiconductor component, and a first mounting element/second mounting element is then applied to the solder material of the top side/underside. The semiconductor component is then heated, for example, by application of an electric current, whereby it is possible to effect a simultaneous mounting/solidification of the soldering material on the top side and underside of the semiconductor component.

The electrical power/the electric current is impressed into the semiconductor component, for example, by the current being passed through at least one part of the solder material. As an alternative, it is also possible to apply an electric current "direct" to the semiconductor component, for example, via one or a plurality of suitable terminals provided on the semiconductor component.

In one embodiment, if a respective soldering contact is intended to be produced both on the top side and on the underside, then the electric current is passed as follows (or the other way round): first through a mounting element applied on the solder material of the top side, then through the solder material of the top side of the semiconductor component, then through the semiconductor component, then through the solder material of the underside of the semiconductor component and finally through the mounting element applied on the solder material of the underside. In this way, it is possible to produce the soldering connection between the semiconductor component and the first mounting element and also a soldering connection between the semiconductor component and the second mounting element.

In order to avoid premature ageing or a migration of the semiconductor component or of the connection complex comprising semiconductor component and mounting elements, the currents used for heating should lie in the normal functional range of the semiconductor component to be mounted.

In one embodiment, the mounting elements are metal plates composed, for example, of copper. However, the mounting elements may also be composed of other materials or be combined with the latter, for example, with semiconductor materials, insulator materials or further metals.

By way of example, the semiconductor component comprises a first part and a second part, the first part being a chip substrate, and the second part being an active region applied on the chip substrate.

The method according to one embodiment of the invention can be applied to any desired semiconductor elements, for example, to a MOS transistor, IGBTs (Insulated Gate Bipolar Transistor), diodes, Smarte Power ICs, etc.

In one embodiment, the electrical power/the electric current is impressed into the semiconductor component such that a high degree of power loss is effected (in the example of a MOS transistor this can be achieved through inverse operation).

By way of example, the power loss is produced by energization of forward diodes that are part of the semiconductor component. As an alternative, however, the semiconductor component may also be driven into breakdown (operation of the semiconductor component at controlled breakdown) or be operated as an active zener structure, and the desired power loss may thus be produced.

In one embodiment, an instantaneous temperature of the semiconductor component is measured and the electrical power impressed into the semiconductor component is regulated in a manner dependent on the measured temperature, so that a specific temperature is set or desired temperature profiles can be realized during a heating phase/a soldering phase/a cooling phase of the semiconductor component. By way of example, such a temperature-dependent regulation of the electrical power makes it possible to prevent the temperature from decreasing too quickly during the cooling phase. In this case, the temperature may be determined for example by impressing a measurement current into the semiconductor component and measuring the associated measurement voltage. In this case, the impressing of the measurement current into the semiconductor component and the measurement of the associated measurement voltage are preferably effected at specific intervals, the impressing of the electrical power being interrupted during corresponding measurement phases. The impressing of the electrical power and the temperature measurement thus alternate continuously in this exemplary embodiment.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
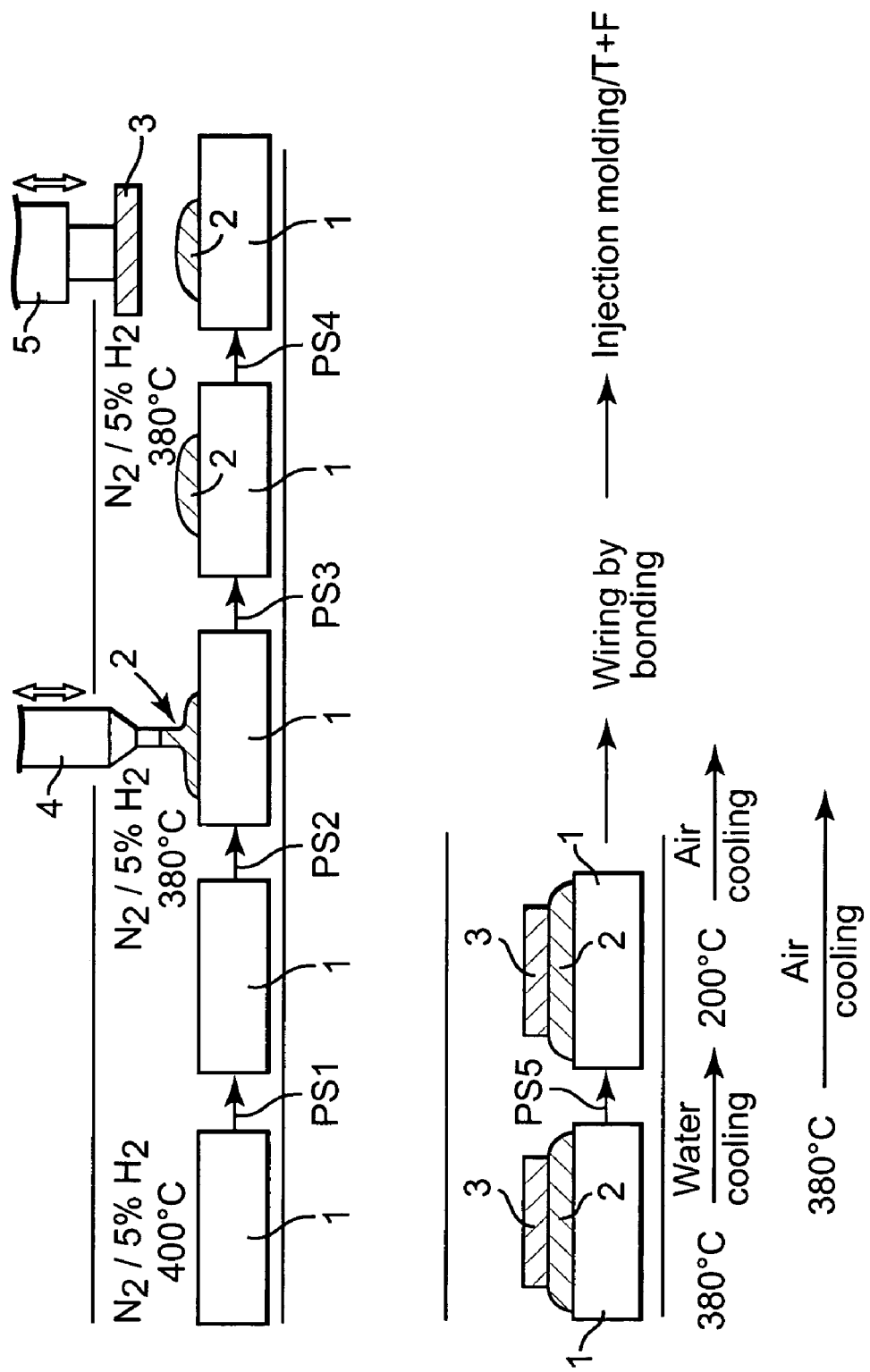
FIG. 1 illustrates an example of a mounting method in accordance with the prior art.
Figure 2:
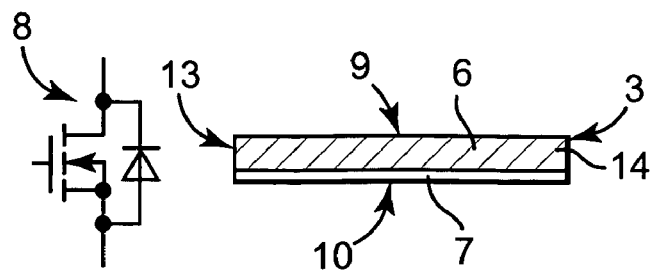
FIG. 2 illustrates a semiconductor component to be mounted, and also an equivalent circuit with respect to the semiconductor component.

FIG. 2 illustrates a semiconductor component 3 (MOS transistor) having a chip substrate 6 and an active region 7 applied thereto. The chip substrate 6 may for example represent a drain zone of the MOS transistor, whereas the active region may be a source zone of the MOS transistor. The functioning of the semiconductor component 3 is described by the circuit 8.

Figure 3:
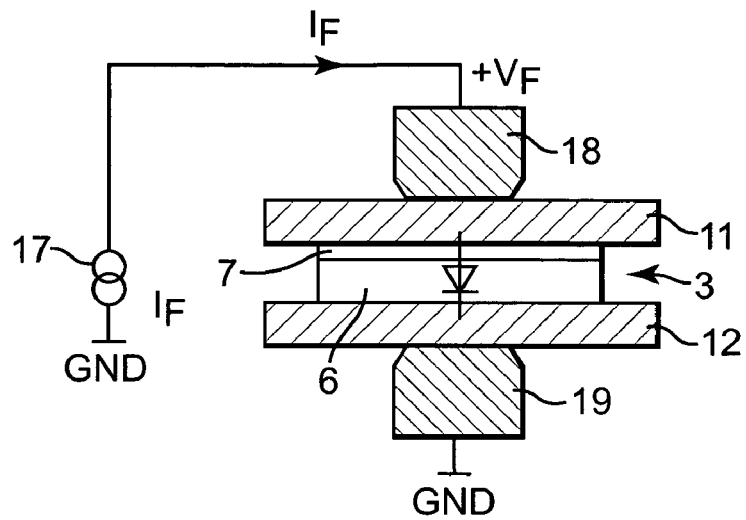
FIG. 3 illustrates a schematic sketch of a first embodiment of the method according to the invention for mounting a semiconductor component.

In order to mount the semiconductor component 3, the MOS transistor, illustrated in FIG. 2, it is the case that, as illustrated schematically in FIG. 3, solder material is applied to a top side 9 and also an underside 10 of the semiconductor component. Afterward, a first/second metal plate 11, 12 is applied to the solder material of the top side 9/underside 10. The first metal plate 11 is electrically connected to a current generator 17 via a first contact 18, which in one embodiment has a low thermal capacity. The second metal plate 12 is electrically grounded via a second contact 19, which in one embodiment has a low thermal capacity.

In order to "weld together" a connection complex comprising electrical component 3, first and second metal plates 11 and 12 and first and second side elements 15 and 16, the current generator 17 generates a current that passes via the first contact 18 through the first metal plate 11, from there through the solder material applied on the top side 9 into the semiconductor component 3, and is passed from there via the solder material applied on the underside of the semiconductor component 3 through the second metal plate 12 to the second contact 19.

The "permeation" of the semiconductor component 3 with the electric current produces power loss in the semiconductor component 3, the heat thus generated causing the solder material to melt on the top side and underside, respectively, of the semiconductor component 3. Soldering contacts between the semiconductor component 3 and the first and second metal plates 11, 12 are produced in this way.

Figure 4:
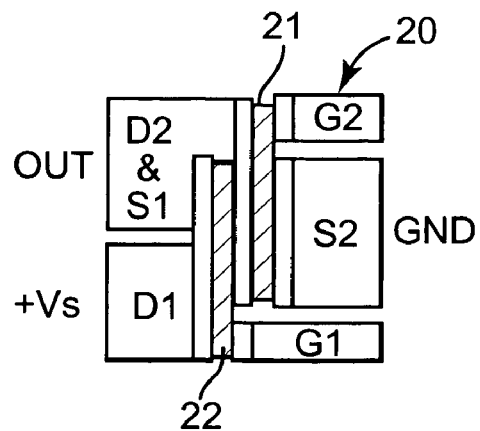
FIG. 4 illustrates a plan view of a power-strip half-bridge as an example of a connection complex that can be produced by the method according to the invention.

FIG. 4 illustrates a possible embodiment of a power-strip half-bridge 20 that can be produced by the method according to the invention. The power-strip half-bridge 20 has: a first semiconductor component 21, a second semiconductor component 22, a first gate G1, a second gate G2, a first source region S1, a second source region S2 and also a first drain region D1 and a second drain region D2.

Figure 5:
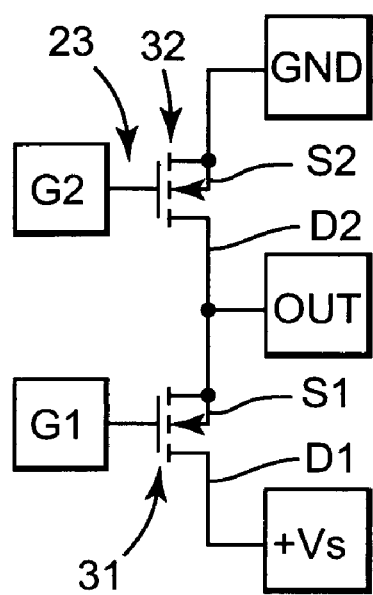
FIG. 5 illustrates an equivalent circuit with respect to the power-strip half-bridge illustrated in FIG. 4.

An equivalent circuit 23 with respect thereto is illustrated in FIG. 5. In this case, the "welding together" of the connection complex illustrated in FIG. 4 could be effected as follows: in a first step, solder material is applied to a top side/underside of the first semiconductor component 21 (semiconductor layer), and the solder material of the underside is connected to the second gate G2 and also to the second source region S2, and the solder material of the top side is connected to the first source region S1 and to the second drain region D2, respectively. Correspondingly, solder material is applied to a top side/underside of the second semiconductor component 22 (semiconductor layer) and the solder material of the underside is connected to the first source region S1 and to the second drain region D2, respectively, and also to the first gate G1, and the solder material of the top side is connected to the first drain region D1 and also to the first source region S1 and to the second drain region D2 (the components described are for this purpose clamped to one another, by way of example). In a second step, a current is impressed into the power-strip half-bridge 20, and permeates the first semiconductor component 21 and the second semiconductor component 22, which generate a heat loss in the process, so that the soldering material melts and corresponding soldering contacts are produced.

Figure 7:
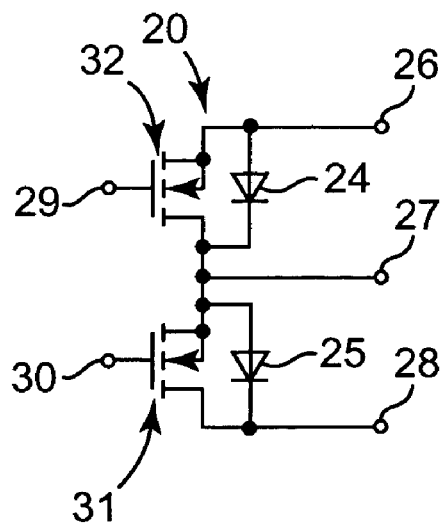
FIG. 7 illustrates a more detailed illustration of the circuit illustrated in FIG. 5.

The impressing of the current or the power into the power-strip half-bridge 20 can be effected in a variety of ways. As can be seen from FIG. 7, a first diode 24 and a second diode 25 of the power-strip half-bridge 20 may be permeated (energized) simultaneously or separately with an electric current, the energization in one embodiment being effected in inverse operation of the first and second diodes 24, 25. In this case, the energization of the first and second diodes 24, 25 produces a power loss which heats corresponding semiconductor structures. In this case, the current is impressed via a first to third terminal 26 to 28. Thus, a fourth and fifth terminal 29, 30 do not need to be used for the heating of the power-strip half-bridge.

Figure 8:
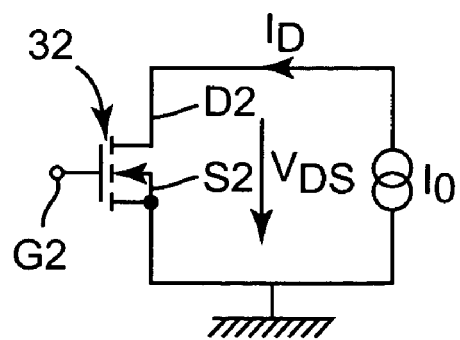
FIG. 8 illustrates a schematic sketch of a second preferred embodiment of the method according to the invention for mounting the semiconductor component illustrated in FIG. 4.
Figure 9:
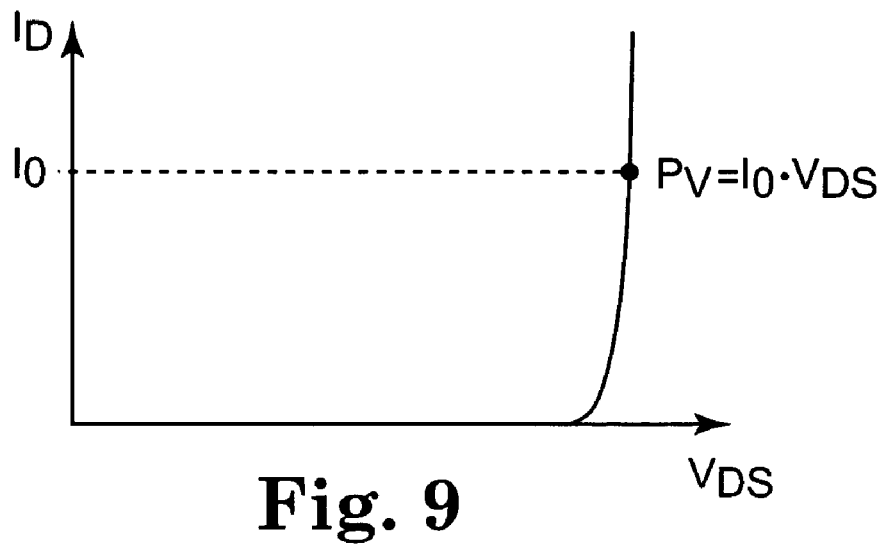
FIG. 9 illustrates a current/voltage diagram for elucidating the second embodiment of the method according to the invention as illustrated in FIG. 8.

As an alternative to this, it is possible to drive one or both MOS transistors 31, 32 in the power-strip half-bridge 20 into breakdown ($V_{DS}$ is positive) and to supply contact current to said transistor or transistors such that the heating power thereof can be utilized for the soldering process. It is optionally possible for both MOS transistors 31, 32 of the power-strip half-bridge to be operated individually or simultaneously at breakdown. This variant of the heating of the power-strip half-bridge 20, which is illustrated in FIG. 8, has the advantage that much less current is required or, for the same current, a higher power can be generated in comparison with the method described in FIG. 7. As can be seen from FIG. 9, a current $I_0$ generated by a current generator 17 is very low since a breakdown voltage $V_{DS}$ is relatively high, so that only a low current $I_0$ is required given a fixed power $P_V = I_0 \cdot V_{DS}$ to be impressed. It is thus possible, by way of example, to heat the power-strip half-bridge 20 with a diode voltage of 0.7 V, whereas approximately 50-70 V are required during breakdown operation of the MOS transistors 31, 32. The currents required for heating the power-strip half-bridge 20 are also correspondingly different (high current for heating with the diodes 24, 25, low current for heating by means of breakdown operation of the MOS transistors 31, 32) given a constant power to be impressed.

Figure 6:
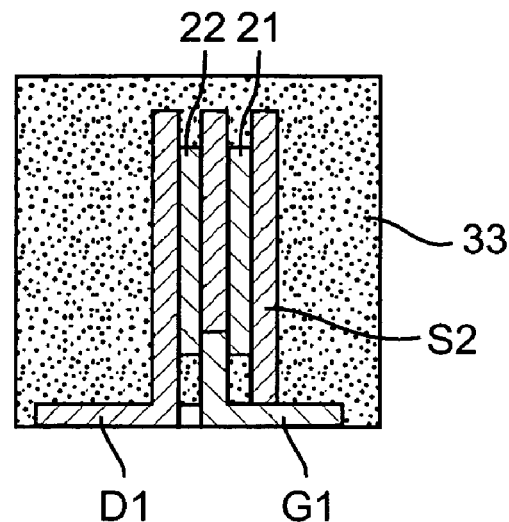
FIG. 6 illustrates a side view of the power-strip half-bridge illustrated in FIG. 4 with an associated housing.

FIG. 6 illustrates the power-strip half-bridge 20 illustrated in FIG. 4 from the downwardly facing side in FIG. 4. In this case, the power-strip half-bridge 20 is accommodated in a housing 33 produced by means of an injection molding method (molding compound).

During the conventional mounting of chips (e.g. in TO housings), the complete material stack (leadframe-solder-chip) is heated to relatively high temperatures (up to 450° C.). As a result, the leadframe oxidizes, which necessitates activation during or cleaning after the chip mounting of the lead frame in order to increase the reliability of the chip soldering and the later adhesion of the molding compound on the leadframe. By means of the self-heating mounting method according to one embodiment of the invention, only the chip itself and directly adjacent regions are heated during the chip mounting, whereby it is possible largely to avoid a temperature-dictated oxidation of the entire leadframe.

This method, similar to spot welding, of heating a local region in order to connect two parts to one another is especially suitable for connecting (soldering) semiconductor chips to different carrier materials. The advantage during the processing of semiconductor chips resides in the controlled areal heating. It must be taken into consideration that the requisite currents lie in the normal functional range of the component. Premature ageing due to migration then need not be feared or can easily be avoided. The current level is significantly reduced during the soldering of a MOS transistor, for example, if for heating instead of the freewheeling diode (with a voltage drop of only 0.7 V) a power MOS transistor is operated with active zenering at approximately 40-50 V. If zener clamping is not possible, operation with a controlled breakdown would be conceivable.

New mounting techniques in accordance with Patent No. DE 196 35 582 C1 (chip stack) necessitate areal chip solderings usually on both sides of the chip. In the case of conventional mounting, it is necessary for this purpose to use two solders having different melting points, since otherwise, during the second soldering step, the first solder connection melts again and then solidifies in an undefined manner. By means of the self-heating mounting method according to one embodiment of the invention, the same solder can be used on both opposite sides of the chip, since the chip is clamped in between the two chip carriers during mounting and the two connecting layers simultaneously melt and solidify again.

According to one embodiment of the invention, the soldering of the top side and underside is accomplished by defined heating of the electrical component. It is thus no longer necessary to heat the complete apparatus.

By way of example, a power loss can be produced in a defined manner in a MOS transistor chip by means of inverse operation. If the intention is to solder a chip on both sides, then it is possible, in accordance with FIG. 2, for the chip to be positioned between the two metal plates of the power-strip housing (blue areas in image 2) and to be electrically connected to suitable contacts having a low thermal capacity.

If a power is then impressed by means of a current or voltage source, the chip can be heated in a defined manner. In the example, the power $P_V$ = forward voltage $V_F$ of the power MOS reverse diode times forward current $I_F$. If the semiconductor component is heated by means of the power loss of diodes, then the forward voltage $V_F$ is, in one embodiment, approximately 0.7 V. If the component is operated at an operating point with a higher voltage, then the current can be correspondingly reduced, as already mentioned above.

Figure 10:
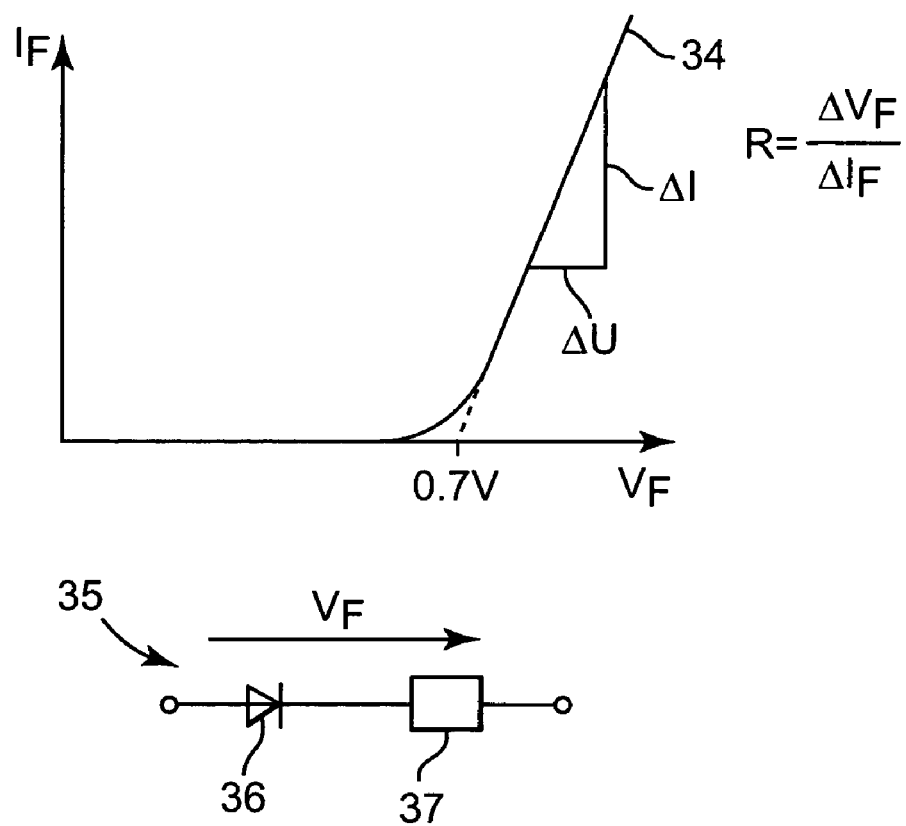
FIG. 10 illustrates a current/voltage diagram for elucidating the self-heating principle according to the invention.

FIG. 10 illustrates a diode characteristic curve 34 and also an equivalent circuit diagram 35 of a real diode. The equivalent circuit diagram 35 comprises a series circuit formed by an ideal diode 36 having a kink voltage of 0.7 V and a diode resistance 37 ($R=\Delta V_F/\Delta I_F$). Depending on the temperature, it is thus possible to regulate the power $P_v=I_F \cdot V_F$ by regulating the voltage $V_F$. A controlled soldering is thus possible.

According to one embodiment of the invention, then the power is impressed into the semiconductor component such that it is always possible to comply with a desired temperature that is ideal for soldering. In order to comply with a specific temperature, it is possible, in a manner analogous to customary methods for measuring thermal resistance, to measure an instantaneous temperature of the semiconductor component by a procedure in which, in short pulses (having a length of 1 ms, for example) in which no power is inserted into the semiconductor component, the forward voltage $P_V$ of the diode or of the transistor is determined by applying a very small measurement current (a few mA) thereto. The temperature of the semiconductor component can in turn be determined from the forward voltage $P_V$ determined. The temperature determination is very precise in this case since the forward voltage $P_V$ has a specific, relatively constant, linear and readily reproducible temperature coefficient. By means of this thermal resistance measuring method, the temperature of the semiconductor component can always be set to desired values (as it were, "online").

By way of example, if the temperature of the semiconductor component rises above an upper limit value, then the impressing of a power into the semiconductor component is stopped until the temperature has fallen again to a value below the upper limit value. If the temperature of the semiconductor component falls below a lower limit value, then power is impressed into the semiconductor component until the temperature has again exceeded the lower limit value. This method makes it possible not only to comply with a specific temperature value but also to achieve a defined heating or cooling of the semiconductor component. In this case, possible roughnesses are automatically lapped since the large current flows through the roughnesses and the surface preferably melts off. As a result of this, the soldering gap (connecting layer) becomes thinner than in the case of conventional methods and thus leads to an improvement in the thermal properties. In addition, the method affords major production and process engineering advantages (fewer process steps, shorter process times, reduction of costs).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A mounting method for a semiconductor component comprising:
    applying a solder material to the semiconductor component;
    applying a mounting element to the semiconductor component in such a way that the solder material is situated between the semiconductor componenet and the mounting element;
    heating at least one part of the semiconductor component to a temperature above the melting point of the solder material by impressing electrical power into the semiconductor component only during a mounting mode, as a result of which the solder material is liquified; and
    cooling the connection complex to solidify the liquid solder material so that corresponding soldering connections arise between the semiconductor component and the mounting element thereby forming a connection complex;
    wherein an instantaneous temperature of the semiconductor component is measured and the electrical power impressed into the semiconductor component is regulated in a manner dependent on the measured temperature, so that a specific temperature or a specific temperature profile is realized during a heating phase of the semiconductor component.

2. A mounting method for a semiconductor component comprising:
    applying a solder material to the semiconductor component;
    applying a mounting element to the semiconductor component in such a way that the solder material is situated between the semiconductor component and the mounting element;
    heating at least one part of the semiconductor component to a temperature above the melting point of the solder material by impressing electrical power into the semiconductor component only during a mounting mode, as a result of which the solder material is liquefied; and
    cooling the connection complex to solidify the liquid solder material so that corresponding solder connections arise between the semiconductor component and the mounting element thereby forming a connection complex;
    wherein an instantaneous temperature of the semiconductor component is measured and the electrical power impressed into the semiconductor component is regulated in a manner dependent on the measured temperature, so that a specific temperature or a specific temperature profile is realized during a heating phase of the semiconductor component.

3. A mounting method for a semiconductor component comprising:
    applying a solder material to the semiconductor component;
    applying a mounting element to the semiconductor component in such a way that the solder material is situated between the semiconductor and the mounting element;
    heating at least one part of the semiconductor component to a temperature above the melting point of the solder material by impressing electrical power into the semiconductor component only during a mounting mode, as a result of which the solder material is liquified; and
    cooling the connection complex to solidify the liquid solder material so that corresponding soldering connections arise between the semiconductor component and the mounting element thereby forming a connection complex;
    wherein an instantaneous temperature of the semiconductor component is measured and the electrical power impressed into the semiconductor component is regulated in a manner dependent on the measured temperature, so that a specific temperature or a specific temperature profile is realized during a cooling phase of the semiconductor component.

4. The method of claim 1, wherein the application of solder material to the semiconductor component including application of the solder material to the mounting element of the semiconductor component.

5. The method of claim 1, wherein the mounting element is made of a material from a group comprising metal, semiconductor material and insulator material.

6. The method of claim 1, wherein solder material is applied to a top side and an underside of the semiconductor component.

7. The method of claim 4, wherein a first mounting element and a second mounting element is applied to the solder material of the top side and the underside of the semiconductor element.

8. The method of claim 7, wherein the electrical power is impressed into the semiconductor component by impressing an electrical current, the latter being passed at least through a part of the solder material.

9. The method of claim 8, wherein the electric current is passed first through the solder material of the top side, then through the semiconductor component and finally through the solder material of the underside, thereby producing a soldering connection between the semiconductor component and the first mounting element and also a soldering connection between the semiconductor component and the second mounting element.

10. The method of claim 8, wherein the currents used for heating lie in the normal functional range of the semiconductor component to be mounted.

11. The method of claim 1, wherein the mounting elements are metal plates.

12. The method of claim 1, wherein the semiconductor component comprises a first part and a second part, the first part being a chip substrate, and the second part being an active region applied on the chip substrate.

13. The method of claim 1, wherein the semiconductor component is a power semiconductor element, in particular a MOS transistor.

14. The method of claim 1, wherein the impressing of the electrical power into the semiconductor component produces a power loss, as a result of which the semiconductor component is heated.

15. The method of claim 8, wherein the impressing of the electrical current into the semiconductor component produces a power loss, as a result of which the semiconductor component is heated.

16. The method of claim 14, wherein the power loss is produced by energization of forward diodes that are part of the semiconductor component.

17. The method of 14, wherein the power loss is produced by operation of the semiconductor component at controlled breakdown or by operation of the semiconductor component as an active zener structure.

18. The method of claim 1, wherein the instantaneous temperature of the semiconductor component is determined by impressing a measurement current into the semiconductor component and measuring the associated measurement voltage.

19. The method as claimed in claim 18, wherein the impressing of the measurement current into the semiconductor component and the measurement of the associated measurement voltage are effected at specific time intervals, the impressing of the electrical power being interrupted during corresponding measurement phases.

* * * * *